United States Patent
Wang et al.

(10) Patent No.: US 9,293,522 B2
(45) Date of Patent: Mar. 22, 2016

(54) METHOD OF MANUFACTURING CAPACITOR AND DISPLAY APPARATUS INCLUDING THE SAME

(71) Applicant: SAMSUNG DISPLAY CO., LTD., Yongin, Gyeonggi-Do (KR)

(72) Inventors: Seong-Min Wang, Yongin (KR); Mu-Gyeom Kim, Yongin (KR); Tae-An Seo, Yongin (KR); Gug-Rae Jo, Yongin (KR); Dae-Young Lee, Yongin (KR); Jung-Gun Nam, Yongin (KR); Dae-Hwan Jang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 156 days.

(21) Appl. No.: 13/972,844

(22) Filed: Aug. 21, 2013

(65) Prior Publication Data

US 2014/0210050 A1    Jul. 31, 2014

(30) Foreign Application Priority Data

Jan. 31, 2013    (KR) .................. 10-2013-0011497

(51) Int. Cl.
*H01L 21/28* (2006.01)
*H01L 29/786* (2006.01)
*H01L 49/02* (2006.01)
*H01L 27/12* (2006.01)
(Continued)

(52) U.S. Cl.
CPC ............ *H01L 28/88* (2013.01); *H01L 27/1255* (2013.01); *H01L 27/3265* (2013.01); *G02F 1/136213* (2013.01)

(58) Field of Classification Search
CPC ........................................ H01L 28/88
USPC .................. 438/190, 210, 250, 393
See application file for complete search history.

(56) References Cited

U.S. PATENT DOCUMENTS

| | | | | |
|---|---|---|---|---|
| 4,409,608 A | * | 10/1983 | Yoder | ............... 257/534 |
| 4,571,543 A | * | 2/1986 | Raymond et al. | ............. 324/425 |
| 6,383,858 B1 | * | 5/2002 | Gupta et al. | .................. 438/238 |

(Continued)

FOREIGN PATENT DOCUMENTS

| | | |
|---|---|---|
| KR | 10-2006-0066342 A | 6/2006 |
| KR | 10-2010-0046478 A | 5/2010 |
| KR | 10-2011-0098915 A | 9/2011 |

OTHER PUBLICATIONS

EPO Search Report dated May 12, 2014, for corresponding European Patent application 14152180.7, (8 pages).

*Primary Examiner* — Earl Taylor
(74) *Attorney, Agent, or Firm* — Lewis Roca Rothgerber Christie LLP

(57) ABSTRACT

Provided is a method of manufacturing a capacitor of a display apparatus, the display apparatus being formed on a substrate and including a thin film transistor, which includes an active layer, a gate electrode, and source and drain electrodes, a display device connected to the thin film transistor, and the capacitor, the method including: forming an electrode layer on the substrate; forming a passivation layer on the electrode layer; patterning the passivation layer to form a first pattern including first branch patterns parallel to each other, and a second pattern including second branch patterns parallel to each other and interposed between the first branch patterns; and forming first and second electrodes by etching the electrode layer using the first and second patterns as masks.

16 Claims, 9 Drawing Sheets

(51) Int. Cl.
*H01L 27/32* (2006.01)
*G02F 1/1362* (2006.01)

(56) References Cited

U.S. PATENT DOCUMENTS

| | | | |
|---|---|---|---|
| 6,458,683 B1* | 10/2002 | Lee | 438/613 |
| 6,955,961 B1* | 10/2005 | Chung | 438/241 |
| 6,999,297 B1* | 2/2006 | Klee et al. | 361/303 |
| 7,956,438 B2* | 6/2011 | Quinn | 257/516 |
| 7,998,330 B2* | 8/2011 | Fang et al. | 205/118 |
| 8,369,107 B2* | 2/2013 | Cho et al. | 361/829 |
| 2003/0036244 A1* | 2/2003 | Jones et al. | 438/397 |
| 2003/0234415 A1* | 12/2003 | Chien | 257/303 |
| 2004/0174655 A1* | 9/2004 | Tsai et al. | 361/306.3 |
| 2006/0125052 A1* | 6/2006 | Moon et al. | 257/595 |
| 2008/0237585 A1* | 10/2008 | Kim | 257/40 |
| 2012/0086683 A1* | 4/2012 | Segura Puchades | 345/205 |
| 2012/0104399 A1* | 5/2012 | Choi et al. | 257/59 |
| 2014/0210050 A1* | 7/2014 | Wang et al. | 257/534 |

* cited by examiner

METHOD OF MANUFACTURING CAPACITOR AND DISPLAY APPARATUS INCLUDING THE SAME

CROSS-REFERENCE TO RELATED PATENT APPLICATION

This application claims priority to and the benefit of Korean Patent Application No. 10-2013-0011497, filed on Jan. 31, 2013, in the Korean Intellectual Property Office, the disclosure of which is incorporated herein in its entirety by reference.

BACKGROUND

1. Field

Aspects of the present invention relate to a method of manufacturing a capacitor and a display apparatus including the capacitor.

2. Description of the Related Art

A liquid crystal having a property between a liquid and a solid is generally used in liquid crystal display apparatuses. Such liquid crystal display apparatuses operate based on an electrical property whereby an arrangement of liquid crystal molecules varies with an external electric field applied thereto and an optical property such as birefringence, optical activity, and light scattering of a liquid crystal cell.

Organic light-emitting display apparatuses, which are self-emitting display apparatuses, do not require a separate light source, and thus, can be driven at a low voltage and easily made thin. In addition, the organic light-emitting display apparatuses have drawn attention as the next-generation display devices because of their high definition characteristics, such as a larger viewing angle, better contrast, and faster response rate.

Display apparatuses such as a liquid crystal display apparatus or an organic light-emitting display apparatus include various types of wiring lines and capacitors, for example, for power supply and signal processing. In addition, due to various requirements, there has been an increasing demand for use of small-sized capacitors in display apparatuses.

SUMMARY

Aspects of the present invention provide a method of manufacturing a capacitor and a display apparatus including the same.

According to an aspect of the present invention, there is provided a method of manufacturing a capacitor of a display apparatus, the display apparatus being on a substrate and including a thin film transistor, which includes an active layer, a gate electrode, a source electrode, and a drain electrode, a display device electrically connected to the thin film transistor, and the capacitor, the method including: forming an electrode layer on the substrate; forming a passivation layer on the electrode layer; patterning the passivation layer to form a first pattern including first branch patterns parallel to each other and to form a second pattern including second branch patterns parallel to each other and interposed between the first branch patterns; and forming a first electrode and a second electrode of the capacitor by etching the electrode layer using the first patterns and the second patterns as masks.

The method may further include forming a photo-resist on a partial area of the passivation layer including the first patterns and the second patterns.

The partial area of the passivation layer where the photo-resist is formed may correspond to any one of the active layer, the gate electrode, or the source electrode and the drain electrode of the thin film transistor.

The forming of the first electrode and the second electrode may include: forming any one of the active layer, the gate electrode, or the source electrode and the drain electrode by etching the electrode layer using the photo-resist as a mask; and forming the first electrode and the second electrode by etching the electrode layer using the first pattern and the second pattern as masks.

The etching of the electrode layer may include: forming the first electrode including a plurality of first branch electrodes parallel to each other by etching the electrode layer using the first pattern as a mask; and forming the second electrode including a plurality of second branch electrodes parallel to each other by etching the electrode layer using the second pattern as a mask.

The forming of the first electrode and the forming of the second electrode may be performed in the same process.

According to one embodiment, the first branch electrodes interdigitate with the second branch electrodes.

The first electrode and the second electrode may be spaced apart from each other.

The method may further include forming an insulating layer in a gap between the first electrode and the second electrode.

The first pattern of the passivation layer may be on the first electrode, and the second pattern of the passivation layer may be on the second electrode.

The etching of the electrode layer may be performed via a dry etching method.

The patterning of the passivation layer may include: forming a polymer layer on the passivation layer; patterning the polymer layer; and forming the first pattern and the second pattern by etching the passivation layer using the patterned polymer layer as a mask.

The patterning of the polymer layer may include: pressurizing and hardening the polymer layer by using a pressurization member including a convex pattern protruding toward the polymer layer and a concave pattern recessed due to the convex pattern; and forming a fine pattern in the polymer layer by removing a residual polymer layer that remained at a location corresponding to the convex pattern of the pressurization member.

The forming of the fine pattern may include removing the residual polymer layer by using plasma.

The forming of the first pattern and the second pattern by etching the passivation layer may be performed via a dry etching method.

The electrode layer may be formed of a same material as any one of materials that the active layer, the gate electrode, or the source electrode and the drain electrode are formed of.

According to one embodiment there is provided a method of manufacturing a capacitor of a display apparatus, the display apparatus being on a substrate and including a thin film transistor, which includes an active layer, a gate electrode, and a source electrode and a drain electrode, a display device electrically connected to the thin film transistor, and the capacitor, the method including: forming an electrode layer on the substrate; forming a passivation layer on the electrode layer; patterning the passivation layer to form a first pattern including first branch patterns parallel to each other, and a second pattern including second branch patterns parallel to each other and interspersed with the first branch patterns; forming a photo-resist on a partial area of the passivation layer including the first pattern and the second pattern; and forming a first electrode and a second electrode of the same material and in the same layer as any one of the active layer, the gate electrode, or the source electrode and the drain electrode by etching the electrode layer using the photo-resist and the first pattern and the second pattern as masks.

According to one embodiment there is provided a display apparatus including a capacitor manufactured by a method of the present invention.

The first electrode may include a plurality of first branch electrodes parallel to each other, the second electrode may be formed in the same layer as the first electrode and may include a plurality of second branch electrodes parallel to each other, and the first branch electrodes may be interspersed with the second branch electrodes.

The capacitor may be formed of the same material and in the same layer as any one of an active layer, a gate electrode, or source and drain electrodes.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
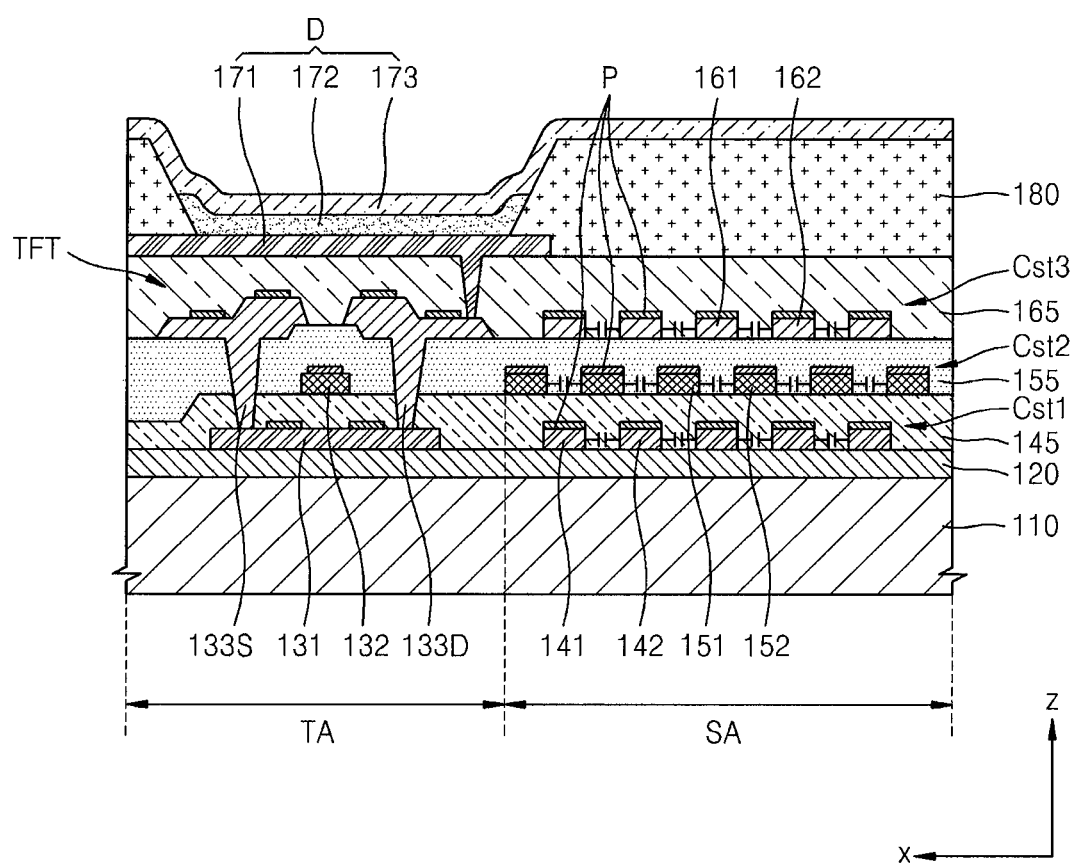
FIG. 1 is a schematic cross-sectional view illustrating a display apparatus according to an embodiment of the present invention.

The present invention is not limited to the embodiments described in the present description, and thus, it should be understood that the present invention does include every kind of variation, alternative, or equivalent covered by the spirit and scope of the present invention. Also, when describing the embodiments, detailed descriptions about well-known functions or configurations that may diminish the clarity of the points of the embodiment of the present invention may be omitted. Also, though terms such as "first" or "second" are used to describe various elements, components, regions, layers, and/or portions in various embodiments of the present invention, the elements, components, regions, layers, and/or portions should not be limited by these terms.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

In the drawings, the thicknesses of layers and regions may be exaggerated for clarity. Throughout the specification, it will also be understood that when an element such as layer, region, or substrate is referred to as being "on" another element, it can be directly on the other element, or one or more intervening elements maybe interposed therebetween. As used herein, the term "and/or" includes any and all combinations of one or more of the associated listed items.

Figure 2:
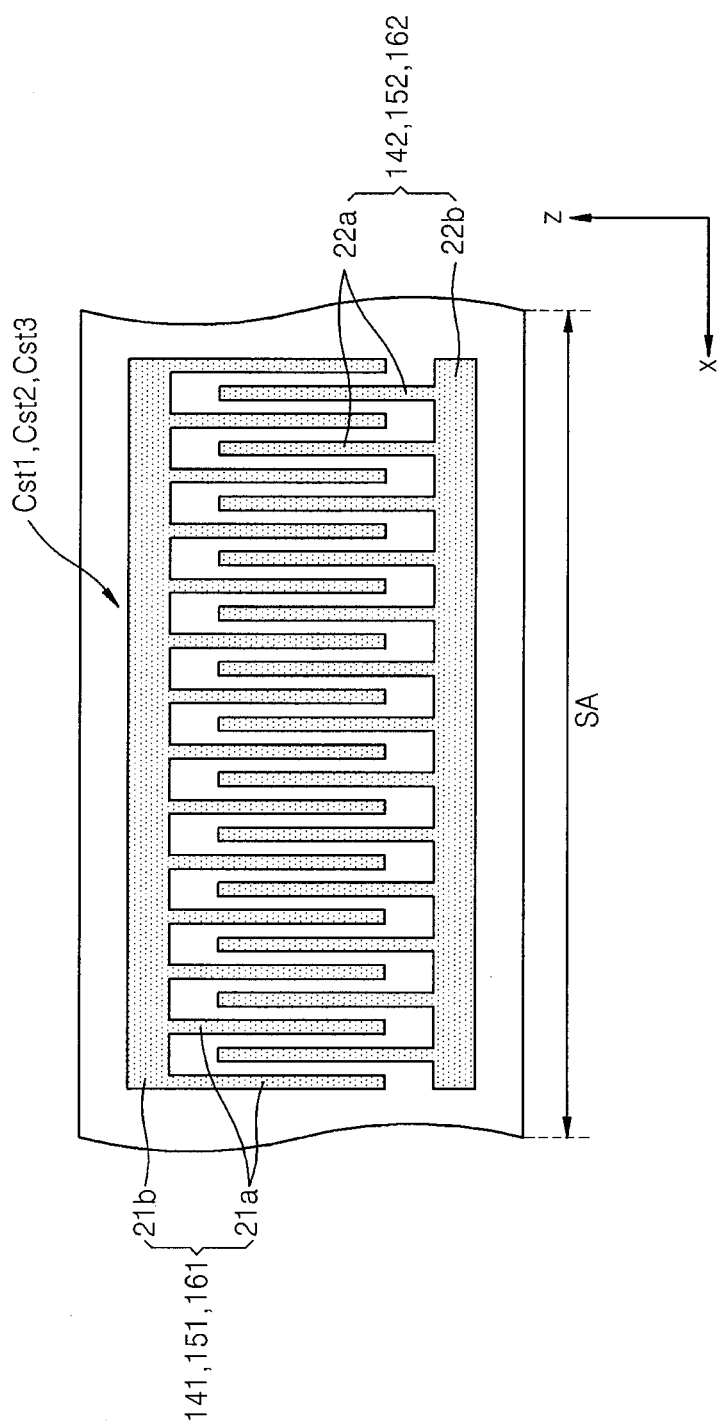
FIG. 2 is a top view illustrating capacitors of FIG. 1.

FIG. 1 is a schematic cross-sectional view illustrating a display apparatus according to an embodiment of the present invention. FIG. 2 is a top view illustrating capacitors of FIG. 1. The display apparatus of FIG. 1 is shown as an organic light-emitting display apparatus; however, embodiments are not limited thereto and may apply to other types of display apparatuses, such as a liquid crystal display apparatus.

Referring to FIG. 1, the display apparatus may include a display element D formed on a substrate 110, a thin film transistor TFT that is formed in a transistor area TA and drives the display element D, and one or more capacitors Cst1, Cst2, and Cst3 that are formed in a storage area CA.

The substrate 110 may be formed of, for example, a plastic having an excellent heat-resisting property and durability. However, the present invention is not limited thereto, and the substrate 110 may be formed of various materials, such as a metal or glass.

A buffer layer 120 may be on the substrate 110. The buffer layer 120 provides a flat surface on the substrate 110 and prevents impurities from entering the display apparatus past the buffer layer 120. The buffer layer 120 may be formed as a single layer or a multiple layer including silicon nitride and/or silicon oxide.

The thin film transistor TFT for driving the display element D, one or more capacitors Cst1, Cst2, and Cst3, a switching thin film transistor (not shown) that may be electrically connected to one or more the capacitors Cst1, Cst2, and Cst3, and wiring lines (not shown) that are connected to the thin film transistor TFT or the capacitors Cst1, Cst2, and Cst3 may be formed on the buffer layer 120. Although only the thin film transistor TFT for driving, which is electrically connected to the display element D to apply a current, is shown in FIG. 1, the display apparatus may also include various other thin film transistors, for example, the switching thin film transistor.

The thin film transistor TFT may include an active layer 131, a gate electrode 132, a source electrode 133S, and a drain electrode 133D. A first insulating interlayer 145, which is a gate insulating layer, is interposed between the gate electrode 132 and the active layer 131 so as to insulate the gate electrode 132 and the active layer 131 from each other. The active layer 131 may include a channel area formed in the middle of the active layer 131, and a source area and a drain area formed on both sides of the channel area. The source area and the drain area that are formed at two edges centered around the channel area may be formed by doping high concentration impurities using the gate electrode 132 as a self-align mask. The active layer 131 may include amorphous silicon or crystal silicon, or may include an oxide semiconductor.

A source electrode 133S and a drain electrode 133D, which are respectively electrically connected to the source area and the drain area of the active layer 131, are provided on the gate electrode 132 with a second insulating interlayer 155 interposed therebetween. A third insulating interlayer 165 may be formed on the source electrode 133S and the drain electrode 133D.

Although a top-gate type thin film transistor TFT is shown in FIG. 1, the present invention is not limited thereto. Thus, in another embodiment, the display apparatus may include a bottom-gate type thin film transistor.

The display element D is formed on the substrate 110, and may include a pixel electrode 171 that is electrically connected to one of the source electrode 133S or the drain electrode 133D of the thin film transistor TFT, a counter electrode 173 that faces the pixel electrode 171, and an intermediate layer 172 that is interposed between the pixel electrode 171 and the counter electrode 173 and includes an organic emission layer. Reference numeral 180 denotes a pixel definition layer.

The organic emission layer may include a low or high molecule organic material. When the organic emission layer includes a low molecular organic material, the intermediate layer 172 may include a hole transport layer and a hole injection layer that are formed toward the electrode 171 with respect to the low molecular organic material and may include an electron transport layer and an electron injection layer that are formed toward the counter electrode 173. Various other layers may be formed as desired. When the organic emission layer includes a high molecular organic material, the intermediate layer 172 may include a hole transport layer (e.g., only a hole transport layer) formed toward the pixel electrode 171. In the organic emission layer, sub-pixels that emit red, green, or blue light may collectively define one unit pixel.

The pixel electrode 171 may be a reflective electrode, and as such, may include therein a metal having a light reflective property. The counter electrode 173 may be transparent/translucent, and thus, the display apparatus may be a top-emission type display apparatus. The reflective electrode may be formed by depositing a metal having a low work function, for example, Ag, Mg, Al, Pt, Pd, Au, Ni, Nd, Ir, Cr, Li, Ca, LiF/Ca, LiF/Al, or a compound thereof. The counter electrode 173 may be formed by thinly depositing a conductive material, for example, indium tin oxide (ITO) or a metal layer (such as magnesium or silver). Although a top-emission type display apparatus has been described in the current embodiment, the present invention is not limited thereto. In another embodiment, the display apparatus may be a bottom-emission type display apparatus.

The capacitors Cst1, Cst2, and Cst3 may store charges during the operation of the display apparatus (e.g., may store charges to apply signals to the thin film transistor TFT for driving even after the switching thin film transistor is turned off). The capacitors Cst1, Cst2, and Cst3 may be formed in the same layer as at least one of the active layer 131, the gate electrode 132, or the source and drain electrodes 133S and 133D of the thin film transistor TFT.

According to one embodiment, when the capacitor Cst1 is formed in the same layer as the active layer 131, the capacitor Cst1 includes the same material as the active layer 131; when the capacitor Cst2 is formed in the same layer as the gate electrode 132, the capacitor Cst2 includes the same material as the gate electrode 132; and when the capacitor Cst3 is formed in the same layer as the source and drain electrodes 133S and 133D of the thin film transistor TFT, the capacitor Cst3 includes the same material as the source and drain electrodes 133S and 133D.

First electrodes 141, 151, and 161 and second electrodes 142, 152, and 162 respectively of the capacitors Cst1, Cst2, and Cst3 are spaced apart from each other along a horizontal direction, and may all be formed through the same process. Thus, the first electrodes 141, 151, and 161 and the second electrodes 142, 152, and 162 respectively of the capacitors Cst1, Cst2, and Cst3 include the same material and are formed in the same layer.

Referring to FIG. 2, the first electrodes 141, 151, and 161 and the second electrodes 142, 152, and 162 may include a plurality of branch electrodes. The first electrodes 141, 151, and 161 may include a plurality of first branch electrodes 21a extending in one direction, and a first bus bar 21b that connects the first branch electrodes 21a to each other. The second electrodes 142, 152, and 162 may include a plurality of second branch electrodes 22a extending in one direction, and a second bus bar 21b connecting the second branch electrodes 22a to each other. The first branch electrodes 21a and the second branch electrodes 22a may be alternately disposed. For example, the first branch electrodes 21a may be interspersed with the second branch electrodes 22a. The first branch electrodes 21a and the second branch electrodes 22a may form an interdigitated structure.

Referring back to FIG. 1, the first electrodes 141, 151, and 161 and the second electrodes 142, 152, and 162 of the respective capacitors Cst1, Cst2, and Cst3 are formed in the same layer, and insulating materials, that is, first to third insulating interlayers 145, 155, and 165, are interposed therebetween. Thus, the first electrodes 141, 151, and 161 and the second electrodes 142, 152, and 162 may respectively form capacitors along a horizontal direction. For example, the first electrodes 141 and the second electrodes 142 may form the capacitor Cst1 along a horizontal direction, the first electrodes 151 and the second electrodes 152 may from the capacitor Cst2 along a horizontal direction, and the first electrodes 161 and the second electrodes 162 may from the capacitor Cst3 along a horizontal direction.

A passivation layer P may be formed on the first electrodes 141, 151, and 161 and the second electrodes 142, 152, and 162 that constitute the respective capacitors Cst1, Cst2, and Cst3. The passivation layer P may formed during a process of manufacturing the capacitors Cst1, Cst2, and Cst3, and the capacitors Cst1, Cst2, and Cst3 may respectively be formed at the same time through the same process as the active layer 131, the gate electrode 132, and the source and drain electrodes 133S and 133D. In this case, the passivation layer P may also be formed on the active layer 131, the gate electrode 132, and the source and drain electrodes 133S and 133D.

Although a case where the capacitors Cst1, Cst2, and Cst3 including the first and second electrodes formed in a horizontal direction are included in the organic light-emitting display apparatus has been described, the present invention is not limited thereto. In another embodiment, a capacitor including the first and second electrodes formed in a horizontal direction may be formed in a liquid crystal display apparatus. The liquid crystal display apparatus is different from the organic light-emitting display apparatus in that a display device includes a liquid crystal instead of an organic emission layer. In the liquid crystal display apparatus, a thin film transistor may have substantially the same structure and may include substantially the same material as the thin film transistor TFT (including the active layer 131, the gate electrode 132, and the source and drain electrodes 133S and 133D). When the display device is included in a liquid crystal display apparatus, the capacitor is formed in the same layer as at least one of an active layer, a gate electrode, or source and drain electrodes, and first and second electrodes constituting the capacitor form an interdigitated structure as shown in FIG. 2.

As described above, a capacitor included in a display apparatus, such as an organic light-emitting display apparatus or a liquid crystal display apparatus, includes first and second electrodes formed in a horizontal direction.

Hereinafter, a process of manufacturing a capacitor of a display apparatus according to an embodiment of the present invention will be described with reference to FIGS. 3 to 10.

Figure 3:
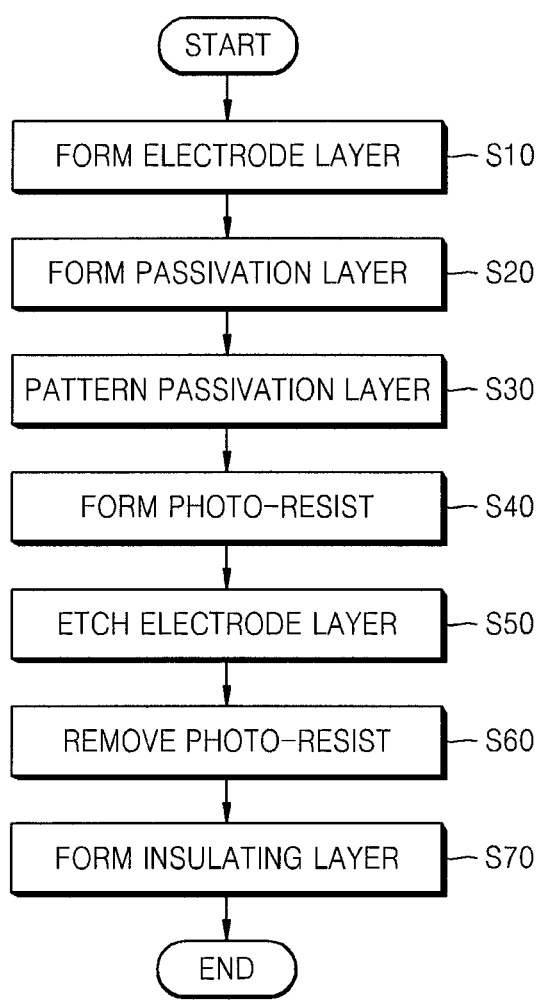
FIG. 3 is a flow chart schematically illustrating a method of manufacturing a capacitor for a display apparatus according to an embodiment of the present invention.

FIG. 3 is a flow chart schematically illustrating a method of manufacturing the capacitor of the display apparatus according to an embodiment of the present invention, and FIGS. 4 to 10 are cross-sectional or perspective views illustrating states according to processes of the manufacturing method of FIG. 3.

Referring to FIG. 3, a method of manufacturing a capacitor of the display apparatus according to an embodiment of the present invention includes: forming an electrode layer S10; forming a passivation layer S20; patterning the passivation layer S30; forming a photo-resist S40; etching the electrode layer S50; removing the photo-resist S60; and forming an insulating layer S70.

Figure 4:
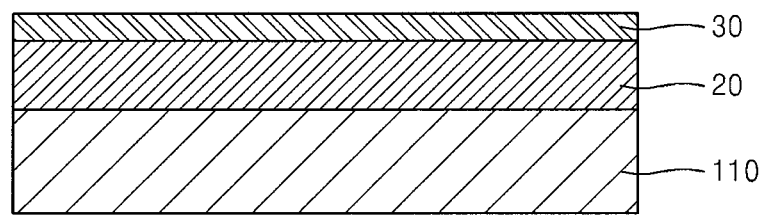
FIG. 4 is a cross-sectional view illustrating a process state according to operations S10 and S20 of FIG. 3.

In operations S10 and S20, as shown in FIG. 4, an electrode layer 20 is formed on the substrate 110, and a passivation layer 30 is formed on the electrode layer 20.

The electrode layer 20 is provided for forming first and second electrodes of the capacitor, which are formed in a horizontal direction through a process to be described later. The electrode layer 20 includes a conductive material, and a capacitance depends on opposing areas of the first and second electrodes. According to one embodiment, the electrode layer 20 may be formed to have a thickness of about 150 nm so that the electrode layer 20 may have a suitable capacitance.

The electrode layer 20 may include a conductive material, such as Al, Mo, Cu, or Ti, an amorphous silicon, or a crystal silicon, or may include an oxide semiconductor.

In an embodiment, when the capacitor provided in the same layer as the source and drain electrodes 133S and 133D or in the same layer as the gate electrode 132 is manufactured according to a method of manufacturing an embodiment of the present invention, the electrode layer 20 may include a conductive metal such as Al, Ti, Cu, or Mo.

In another embodiment, when the capacitor provided in the same layer as the active layer 131 is manufactured according to a manufacturing method of an embodiment of the present invention, the electrode layer 20 may include an amorphous silicon or a crystal silicon, or may include an oxide semiconductor. When the electrode layer 20 includes an oxide semiconductor, the electrode layer 20 may be doped with impurities through a doping process to form a gate electrode, and, the gate electrode may be used as a self-aligned mask.

The passivation layer 30 is formed on the electrode layer 20 and may include SiOx. Alternatively, the passivation layer 30 may include Ti and/or Mo. The passivation layer 30 may be used as a self mask during an etching process of the electrode layer 20 for forming the first and second electrodes of the capacitor. The passivation layer 30 may be formed to be thinner than the electrode layer 20. For example, the passivation layer 30 may be formed to have a thickness that is about ⅕ of the electrode layer 20.

In operation S30, as shown in FIGS. 5A to 5G, the passivation layer 30 is patterned. The passivation layer 30 includes a first pattern 31 and a second pattern 32 (see FIG. 5G). The first pattern 31 includes a plurality of first branch patterns 31a that are parallel to each other and a first bus pattern 31b connecting the first branch patterns 31a, and the second pattern 32 includes a plurality of second branch patterns 32a that are parallel to each other and are interposed between the first branch patterns 31a, and includes a second bus pattern 32b connecting the second branch patterns 32a.

Hereinafter, a detailed process of patterning the passivation layer 30 will be described with reference to FIGS. 5A to 5G.

Figure 5A:
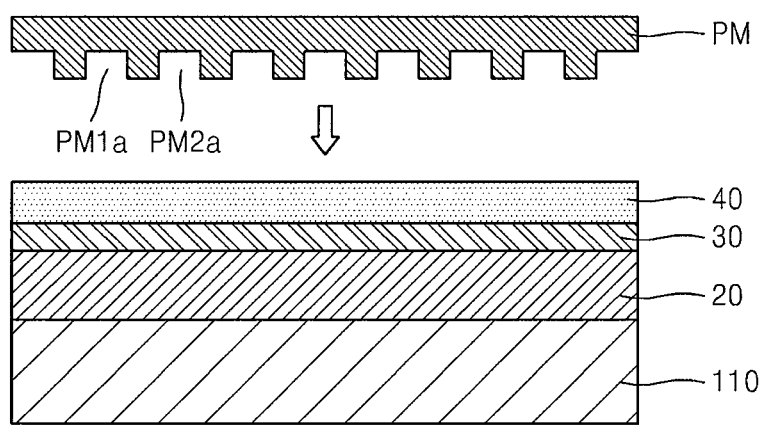
FIGS. 5A and 5C to 5F are cross-sectional view illustrating process states according to operation S30 of FIG. 3.

Referring to FIG. 5A, a polymer layer 40 is formed on the passivation layer 30. The polymer layer 40 may include a polyamide (PA)-based material having a photo-curing property or a heat-curing property. The polymer layer 40 may be formed to be thicker than the passivation layer 30 in order to form fine patterns by a pressurization member PM to be described later. For example, the polymer layer 40 may be formed to be thicker than the passivation layer 30 by about two to four times. The polymer layer 40 may be formed using any of various methods, such as spin coating or spray coating.

Figure 5B:
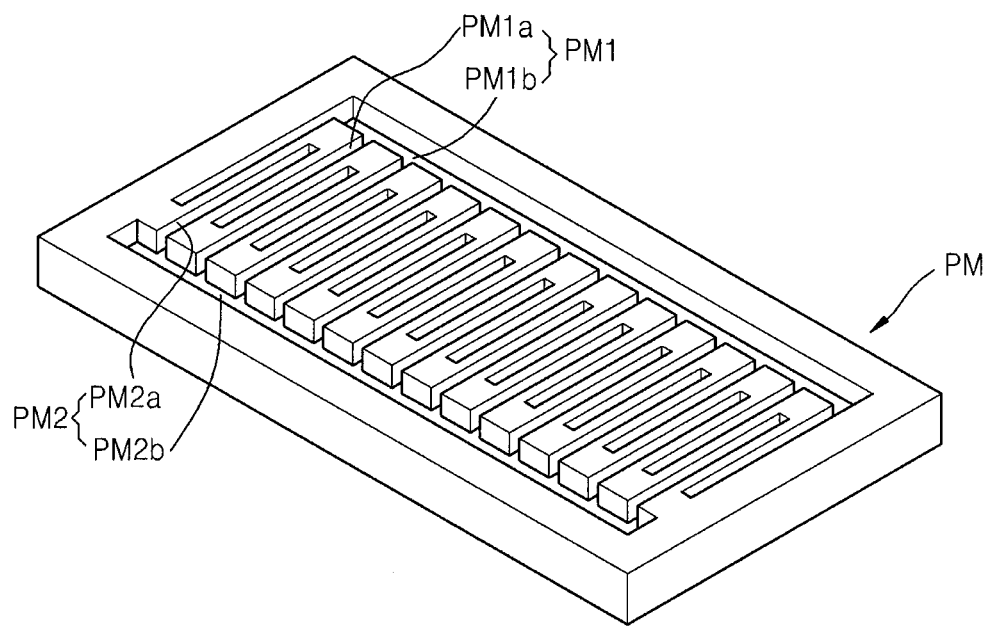
FIG. 5B is a perspective view illustrating a lower surface of a pressurization member used in operation S30.

Thereafter, the polymer layer 40 is pressed using the pressurization member PM as shown in FIG. 5B. FIG. 5B is a perspective view of the pressurization member PM on which fine patterns are formed on a bottom thereof. For convenience of description, in FIG. 5B, the pressurization member PM is illustrated upside down with the bottom thereof being directed upward.

Referring to FIG. 5B, the pressurization member PM includes fine patterns. The pressurization member PM includes serpentine convex patterns and concave patterns that are relatively recessed with respect to the convex patterns throughout the pressurization member PM. The concave pattern includes a first concave pattern PM1 and a second concave pattern PM2. The first concave pattern PM1 includes a plurality of first branch concave patterns PM1a that are parallel to each other, and a first bus concave pattern PM1b connecting the first branch concave patterns PM1a. The second concave pattern PM2 includes a plurality of second branch concave patterns PM2a that are parallel to each other and interposed between the first branch concave patterns PM1a, and a second bus concave pattern PM1b connecting the second branch concave patterns PM2a.

The pressurization member PM may include quartz, or a material such as PET, PC, or PEN. Fine patterns are formed in the polymer layer 40 by compressing the pressurization member PM. For example, the pressurization member PM presses the polymer layer 40, and thus, the polymer layer 40 is filled between the concave patterns of the pressurization member PM, thereby allowing patterns to be transferred to the polymer layer 40.

Thereafter, in a state where the pressurization member PM presses the polymer layer 40, the polymer layer 40 is hardened. The polymer layer 40 may be hardened by light, such as ultra violet (UV) rays, or heat. When the polymer layer 40 is hardened by light, such as UV rays, the pressurization member PM may be formed of a transparent material so that the light may be sufficiently transmitted.

Figure 5C:
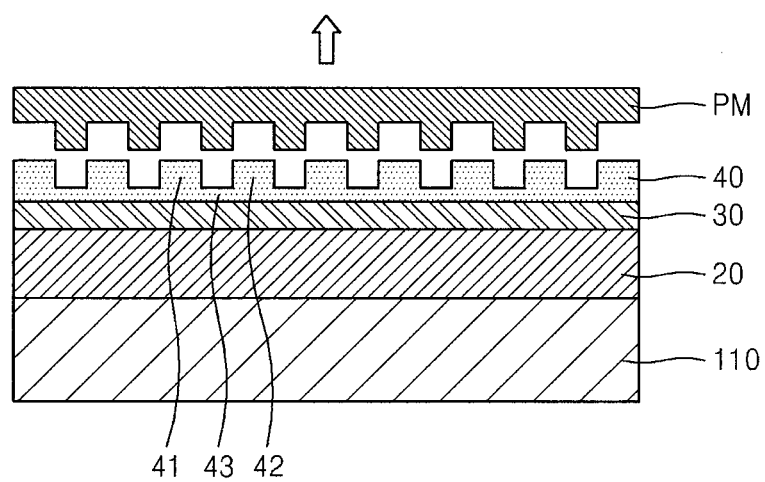

Referring to FIG. 5C, after the hardening of the polymer layer 40, the pressurization member PM is removed. Fine patterns are formed in the polymer layer 40 by the pressurization member PM. In other words, a first fine pattern 41 and a second fine pattern 42 respectively corresponding to the first concave pattern PM1 and the second concave pattern PM2 of the pressurization member PM are formed in the polymer layer 40. The first fine pattern 41 has an inversed shape of the first concave pattern PM1 of the pressurization member PM, and the second fine pattern 42 has an inversed shape of the second concave pattern PM2 of the pressurization member PM.

Figure 5D:
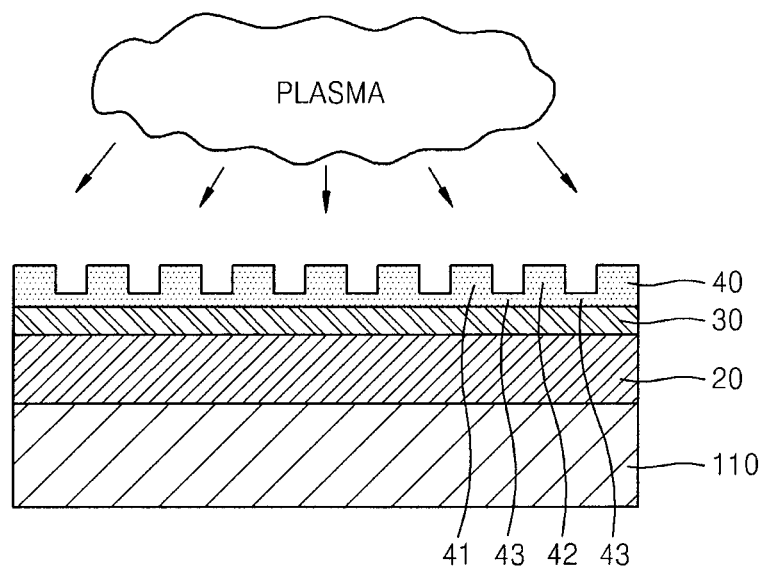
Figure 5E:
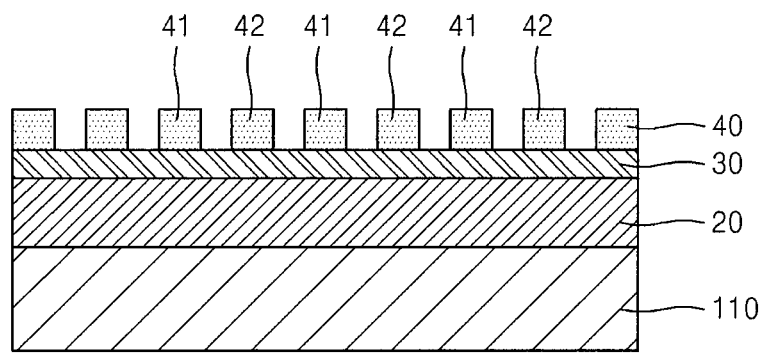

Referring to FIG. 5D, a residual polymer layer 43 that remains between the first fine pattern 41 and the second fine pattern 42 of the polymer layer 40 is removed. The residual polymer layer 43 is formed at a location corresponding to the convex patterns of the pressurization member PM. As shown in FIG. 5D, the residual polymer layer 43 may be removed by plasma using, for example, CF4 and/or $O_2$. FIG. 5E shows a state where the residual polymer layer 43 is removed.

Figure 5F:
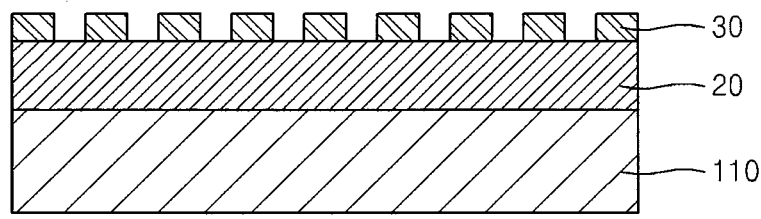
Figure 5G:
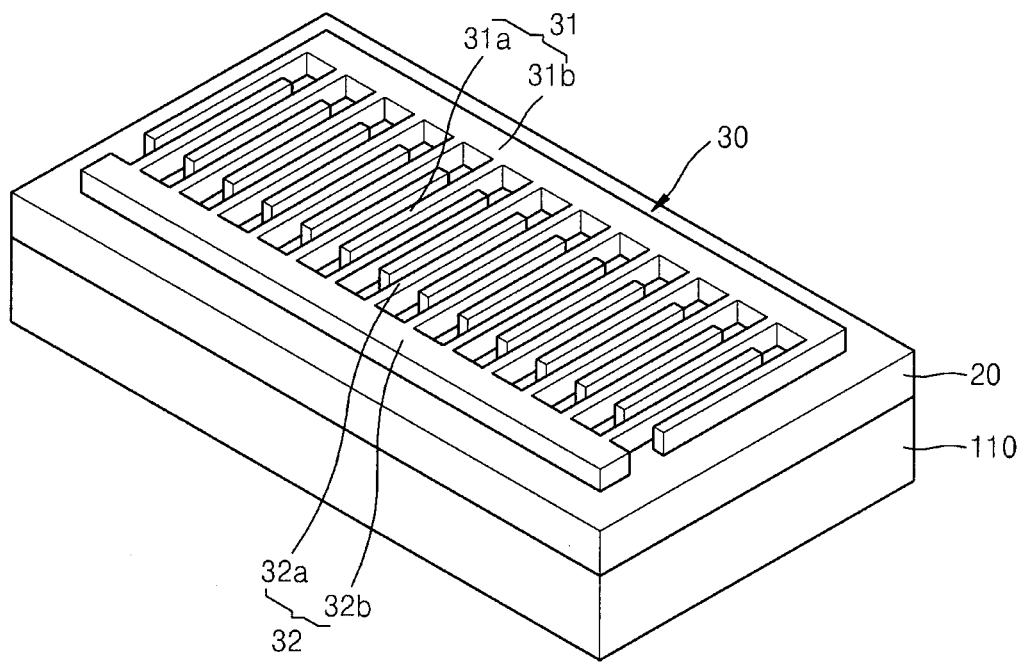
FIG. 5G is a perspective view of FIG. 5F.

Referring to FIGS. 5E and 5F, the passivation layer 30 is patterned using the polymer layer 40 (in which the first fine pattern 41 and the second fine pattern 42 are formed) as a mask. The passivation layer 30 may be patterned by etching a portion that is not covered by the polymer layer 40. The passivation layer 30 may be patterned by dry etching using at least one selected from the group consisting of $SF_6$, $O_2$, $C_4F_8$, Ar, $CF_4$, and $CHF_3$. After patterning the passivation layer 30, the polymer layer 40 is removed.

The passivation layer 30 patterned through the process that is described with reference to FIGS. 5A to 5F includes, as shown in FIG. 5F, the first pattern 31 and the second pattern 32, wherein the first pattern 31 includes the plurality of first branch patterns 31a that are parallel to each other and the first bus pattern 31b connecting the first branch patterns 31a, and wherein the second pattern 32 includes the second branch patterns 32a that are parallel to each other and interposed between the first branch patterns 31a, and the second bus pattern 32b connecting the second branch patterns 32a.

Figure 6:
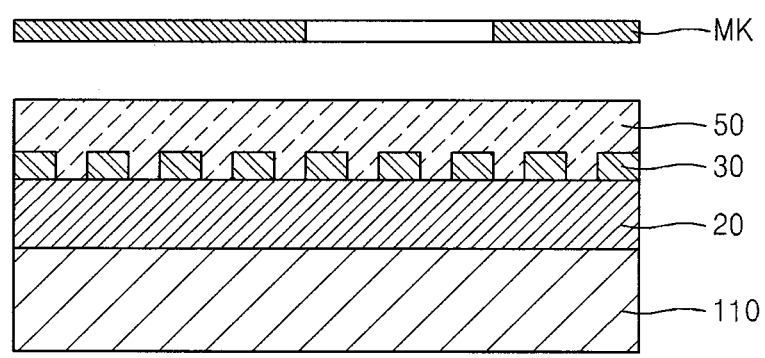
FIGS. 6 and 7 are cross-sectional views illustrating a process state according to operation S40 of FIG. 3.
Figure 7:
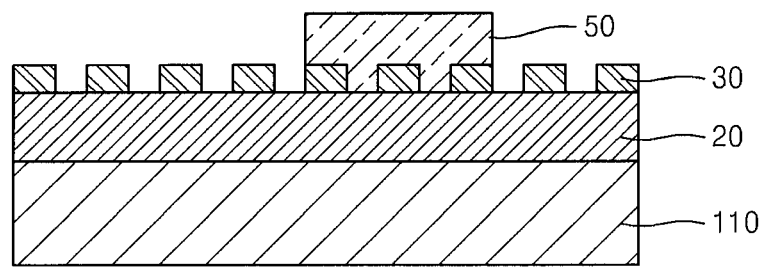

In operation S40, a photo-resist 50 may be formed on a partial area of the passivation layer 30 that is patterned as shown in FIG. 6. After the photo-resist 50 is deposited on the entire passivation layer 30, the photo-resist 50 is exposed at the partial area via a mask MK in which an opening is formed, and remaining areas that have not been exposed are then removed, thereby completing the forming of the photo-resist as shown in FIG. 7. The electrode layer 20 and the passivation layer 30 that are covered by the photo-resist 50 may constitute any one of the active layer 131, the gate electrode 132, and the source and drain electrodes 133S and 133D of the thin film transistor TFT.

Figure 8:
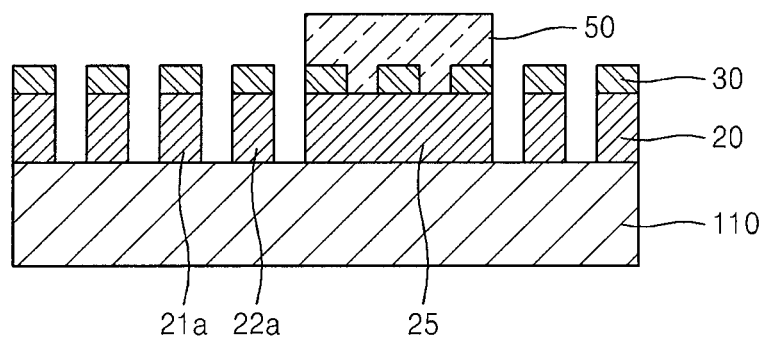
FIG. 8 is a cross-sectional view illustrating a process state according to operation S50 of FIG. 3.

In operation S50, as shown in FIG. 8, the electrode layer 20 is etched. The first electrode and the second electrode of the capacitor are formed through the etching of the electrode layer 20. The first and second electrodes are concurrently (or simultaneously) formed through the etching of the electrode layer 20, and the first and second electrode layers include the first and second branch electrodes 21a and 22a that are spaced part and form an interdigitated structure.

The electrode layer 20 may be etched by dry etching using the photo-resist 50 and the passivation layer 30 as a mask. In an embodiment, the electrode layer 20 may be etched by dry etching using any one gas selected from the group consisting of $CF_4$, $C_4F_8$, $Cl_2$, $BCl_3$, $O_2$, and Ar. Alternatively, the electrode layer 20 may be etched by dry etching using gas including $Cl_2$ and $O_2$ or gas including $Cl_2$ and Ar.

Figure 9:
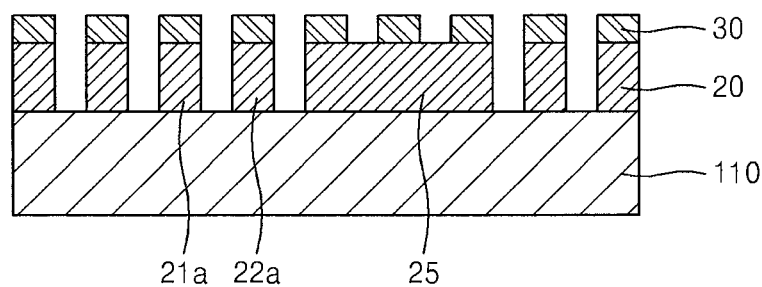
FIG. 9 is a cross-sectional view illustrating a process state according to an operation S60 of FIG. 3.
Figure 10:
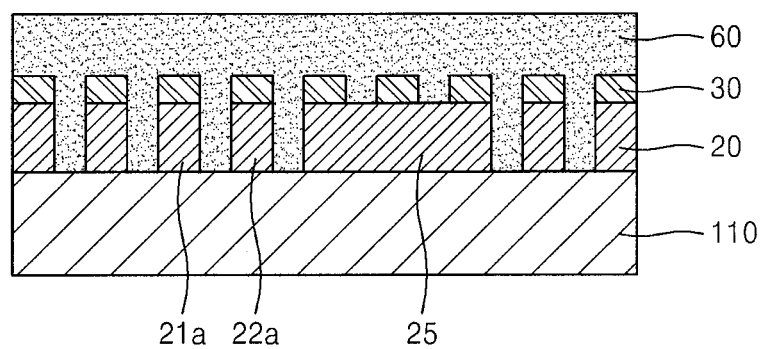
FIG. 10 is a cross-sectional view illustrating a process state according to an operation S70 of FIG. 3.

In operation S60, the photo-resist 50 is removed as shown in FIG. 9, and in operation S70, an insulating layer 60 is formed between the first and second electrodes, specifically between the first and second branch electrodes 21a and 22a as shown in FIG. 10. The first and second branch electrodes 21a and 22a with the insulating layer 60 interposed therebetween may form the capacitor along a horizontal direction.

As described above, the first and second electrodes of the capacitor which are formed in operation S50 described above form the first and second branch electrodes 21a and 22a that form an interdigitated structure, and a partial area 25 of the electrode layer which is covered by the photo-resist 50 forms a component of the thin film transistor TFT shown in FIG. 1. In other words, the component of the thin film transistor and the capacitor are formed in the same layer so as to include the same material.

In an embodiment, when the manufacturing method according to the embodiment of the present invention is performed after forming the buffer layer 120 of FIG. 1, the first and second branch electrodes 21a and 22a of FIG. 10 may become branch electrodes of the first and second electrodes 141 and 142 of the capacitor Cst1 of FIG. 1, the partial area 25 of the electrode layer of FIG. 10 may become the active layer 131 of FIG. 1, and the insulating layer 60 of FIG. 10 may become the first insulating interlayer 145 of FIG. 1.

In one embodiment, when the manufacturing method is performed after forming the first insulating interlayer 145 of FIG. 1, the first and second branch electrodes 21a and 22a may become the branch electrodes of the first and second electrodes 151, 152 of the capacitor Cst2 shown in FIG. 1, the partial area 25 of the electrode layer may become the gate electrode 132, and the insulating layer 60 may become the second insulating interlayer 155.

In one embodiment, when the manufacturing method is performed after forming the second insulating interlayer 155 of FIG. 1, the first and second branch electrodes 21a and 22a may become the branch electrodes of the first and second electrodes 161 and 162 of the capacitor Cst3 shown in FIG. 1, the partial area 25 of the electrode layer may become the source/drain electrodes 133S/133D, and the insulating layer 60 may become the third insulating interlayer 165.

According to an embodiment of the present invention, any one of an active layer, a gate electrode, or source and drain electrodes of a thin film transistor, and a capacitor having branch electrodes that are formed in a horizontal direction and form an interdigitated structure may be formed at the same time.

During a process for forming the branch electrodes interdigitated with each other, the number of masks may be reduced (or minimized) by using a passivation layer as a self mask.

According to one embodiment, an interval between the first and second branch patterns of the passivation layer may be minutely adjusted through a relatively easy method for patterning the passivation layer by using a pressurization member. For example, the interval between the first and second branch electrodes adjacent to each other may be adjusted to be about 20 nm. The minute adjustment of the first and second branch patterns of the passivation layer means that an interval between first and second electrodes of the capacitor, which are formed using the passivation layer as a mask, is minutely adjusted. As such, the interval between the first and second branch electrodes is minutely adjusted, thereby improving the integration of the capacitor and a capacitance per unit area.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a capacitor of a display apparatus, the display apparatus being on a substrate and comprising a thin film transistor, which comprises an active layer, a gate electrode, a source electrode, and a drain electrode, a display device electrically connected to the thin film transistor, and the capacitor, the method comprising:
  forming an electrode layer on the substrate;
  forming a passivation layer on the electrode layer;
  forming a photo-resist on a partial area of the passivation layer corresponding to a first pattern and a second pattern;

patterning the passivation layer to form the first pattern comprising first branch patterns parallel to each other and to form the second pattern comprising second branch patterns parallel to each other and respectively interposed between the first branch patterns; and forming a first electrode and a second electrode of the capacitor by etching the electrode layer using the first pattern and the second pattern as masks.

2. The method of claim 1, wherein the partial area of the passivation layer where the photo-resist is formed corresponds to any one of the active layer, the gate electrode, or the source electrode and the drain electrode of the thin film transistor.

3. The method of claim 1, wherein the forming of the first electrode and the second electrode comprises:

forming any one of the active layer, the gate electrode, or the source electrode and the drain electrode by etching the electrode layer using the photo-resist as a mask; and forming the first electrode and the second electrode by etching the electrode layer using the first pattern and the second pattern as masks.

4. The method of claim 1, wherein the etching of the electrode layer comprises:

forming the first electrode comprising a plurality of first branch electrodes parallel to each other by etching the electrode layer using the first pattern as a mask; and forming the second electrode comprising a plurality of second branch electrodes parallel to each other by etching the electrode layer using the second pattern as a mask.

5. The method of claim 4, wherein the forming of the first electrode and the forming of the second electrode are performed in a same process.

6. The method of claim 4, wherein the first branch electrodes interdigitate with the second branch electrodes.

7. The method of claim 6, wherein the first electrode and the second electrode are spaced apart from each other.

8. The method of claim 7, further comprising forming an insulating layer in a gap between the first electrode and the second electrode.

9. The method of claim 1, wherein the first pattern of the passivation layer is on the first electrode, and the second pattern of the passivation layer is on the second electrode.

10. The method of claim 1, wherein the etching of the electrode layer is performed via a dry etching method.

11. The method of claim 1, wherein the patterning of the passivation layer comprises:

forming a polymer layer on the passivation layer;
patterning the polymer layer; and
forming the first pattern and the second pattern by etching the passivation layer using the patterned polymer layer as a mask.

12. A method of manufacturing a capacitor of a display apparatus, the display apparatus being on a substrate and comprising a thin film transistor, which comprises an active layer, a gate electrode, a source electrode, and a drain electrode, a display device electrically connected to the thin film transistor, and the capacitor, the method comprising:

forming an electrode layer on the substrate;
forming a passivation layer on the electrode layer;
patterning the passivation layer to form a first pattern comprising first branch patterns parallel to each other and to form a second pattern comprising second branch patterns parallel to each other and respectively interposed between the first branch patterns; and
forming a first electrode and a second electrode of the capacitor by etching the electrode layer using the first pattern and the second pattern as masks,
wherein the patterning of the passivation layer comprises:
forming a polymer layer on the passivation layer;
patterning the polymer layer; and
forming the first pattern and the second pattern by etching the passivation layer using the patterned polymer layer as a mask, and
wherein the patterning of the polymer layer comprises:
pressurizing and hardening the polymer layer by using a pressurization member comprising a convex pattern protruding toward the polymer layer and a concave pattern recessed due to the convex pattern; and
forming a fine pattern in the polymer layer by removing a residual polymer layer that remained at a location corresponding to the convex pattern of the pressurization member.

13. The method of claim 12, wherein the forming of the fine pattern comprises removing the residual polymer layer by using plasma.

14. The method of claim 11, wherein the forming of the first pattern and the second pattern by etching the passivation layer is performed via a dry etching method.

15. The method of claim 1, wherein the electrode layer is formed of a same material as any one of materials that the active layer, the gate electrode, or the source electrode and the drain electrode are formed of.

16. A method of manufacturing a capacitor of a display apparatus, the display apparatus being on a substrate and comprising a thin film transistor, which comprises an active layer, a gate electrode, and a source electrode and a drain electrode, a display device electrically connected to the thin film transistor, and the capacitor, the method comprising:

forming an electrode layer on the substrate;
forming a passivation layer on the electrode layer;
patterning the passivation layer to form a first pattern comprising first branch patterns parallel to each other, and a second pattern comprising second branch patterns parallel to each other and interspersed with the first branch patterns;
forming a photo-resist on a partial area of the passivation layer comprising the first pattern and the second pattern; and
forming a first electrode and a second electrode of a same material and in a same layer as any one of the active layer, the gate electrode, or the source electrode and the drain electrode by etching the electrode layer using the photo-resist and the first pattern and the second pattern as masks.

* * * * *